(12) United States Patent
Shor

(10) Patent No.: US 6,885,244 B2
(45) Date of Patent: Apr. 26, 2005

(54) OPERATIONAL AMPLIFIER WITH FAST RISE TIME

(75) Inventor: Joseph S. Shor, Tel Mond (IL)

(73) Assignee: Saifun Semiconductors Ltd., Netanya (IL)

( * ) Notice: Subject to any disclaimer, the term of this patent is extended or adjusted under 35 U.S.C. 154(b) by 23 days.

(21) Appl. No.: 10/394,255

(22) Filed: Mar. 24, 2003

(65) Prior Publication Data

US 2004/0189385 A1 Sep. 30, 2004

(51) Int. Cl.⁷ ................................................ H03F 3/45
(52) U.S. Cl. ........................................ 330/253; 330/259
(58) Field of Search ................................ 330/253, 255, 330/257, 261, 264, 259; 323/280

(56) References Cited

U.S. PATENT DOCUMENTS

| | | | |
|---|---|---|---|
| 4,961,010 A | 10/1990 | Davis | |
| 5,029,063 A | 7/1991 | Lingstaedt et al. | |
| 5,081,371 A | 1/1992 | Wong | |
| 5,142,495 A | 8/1992 | Canepa | |
| 5,142,496 A | 8/1992 | Van Buskirk | |
| 5,276,646 A | 1/1994 | Kim et al. | |
| 5,280,420 A | 1/1994 | Rapp | |
| 5,381,374 A | 1/1995 | Shiraishi et al. | |
| 5,534,804 A | 7/1996 | Woo | |
| 5,553,030 A | 9/1996 | Tedrow et al. | |
| 5,559,687 A | 9/1996 | Nicollini et al. | |
| 5,581,252 A | 12/1996 | Thomas | |
| 5,612,642 A | 3/1997 | McClintock | |
| 5,636,288 A | 6/1997 | Bonneville et al. | |
| 5,663,907 A | 9/1997 | Frayer et al. | |
| 5,672,959 A | 9/1997 | Der | |
| 5,675,280 A | 10/1997 | Nomura et al. | |
| 5,708,608 A | 1/1998 | Park et al. | |
| 5,717,581 A | 2/1998 | Canclini | |
| 5,726,946 A | 3/1998 | Yamagata et al. | |
| 5,760,634 A | 6/1998 | Fu | |
| 5,808,506 A | 9/1998 | Tran | |
| 5,815,435 A | 9/1998 | Van Tran | |
| 5,847,441 A | 12/1998 | Cutter et al. | |
| 5,880,620 A | 3/1999 | Gitlin et al. | |
| 5,903,031 A | 5/1999 | Yamada et al. | |
| 5,910,924 A | 6/1999 | Tanaka et al. | |
| 5,946,258 A | 8/1999 | Evertt et al. | |
| 5,963,412 A | 10/1999 | En | |
| 6,005,423 A | 12/1999 | Schultz | |
| 6,028,324 A | 2/2000 | Su et al. | |

(Continued)

FOREIGN PATENT DOCUMENTS

| | | |
|---|---|---|
| EP | 0693781 | 1/1996 |
| EP | 0 843 398 | 5/1998 |
| JP | 02001118392 | 4/2001 |

OTHER PUBLICATIONS

Martin, "Improved Circuits for the Realization of Switched--Capacitor Filters", IEEE Transactions on Circuits and Systems, Apr., 1980, pp. 237–244, vol. CAS–27.

Klinke, et al., "A Very–High–Slew–Rate CMOS Operational Amplifier", IEEE Journal of Solid–State Circuits, 1989, pp. 744–746, vol. 24.

Shor, et al., "paper WA2.04.01—Self regulated Four–Phased Charge Pump with Boosted Wells", ISCAS 2002, 2002.

Fotouhi, "An Efficient CMOS Line Driver for 1.544–Mb/s T1 and 2.048–Mb/s E1 Applications", IEEE Journal of Solid–State Circuits, 2003, pp. 226–236, vol. 38.

*Primary Examiner*—Steven J. Mottola
(74) *Attorney, Agent, or Firm*—Eitan Law Group

(57) ABSTRACT

An operational amplifier comprising an inverting stage transistor that drives current to an output of the operational amplifier through a current path, and an auxiliary transistor that adds transient current to the current path and which remains dormant under steady-state conditions.

15 Claims, 10 Drawing Sheets

U.S. PATENT DOCUMENTS

| | | |
|---|---|---|
| 6,040,610 A | 3/2000 | Noguchi et al. |
| 6,064,251 A | 5/2000 | Park |
| 6,075,402 A | 6/2000 | Ghilardelli et al. |
| 6,081,456 A | 6/2000 | Dadashev |
| 6,094,095 A | 7/2000 | Murray et al. |
| 6,107,862 A | 8/2000 | Mukainakano et al. |
| 6,118,207 A | 9/2000 | Ormerod et al. |
| 6,130,572 A | 10/2000 | Ghilardelli et al. |
| 6,130,574 A | 10/2000 | Bloch et al. |
| 6,150,800 A | 11/2000 | Kinoshita et al. |
| 6,154,081 A | 11/2000 | Pakkala et al. |
| 6,157,242 A | 12/2000 | Fukui |
| 6,188,211 B1 | 2/2001 | Rincon-Mora et al. |
| 6,198,342 B1 | 3/2001 | Kawai |
| 6,208,200 B1 | 3/2001 | Arakawa |
| 6,246,555 B1 | 6/2001 | Tham |
| 6,285,614 B1 | 9/2001 | Mulatti et al. |
| 6,297,974 B1 | 10/2001 | Ganesan et al. |
| 6,339,556 B1 | 1/2002 | Watanabe |
| 6,353,356 B1 | 3/2002 | Liu |
| 6,356,469 B1 | 3/2002 | Roohparvar et al. |
| 6,359,501 B2 | 3/2002 | Lin et al. |
| 6,400,209 B1 | 6/2002 | Matsuyama et al. |
| 6,433,624 B1 | 8/2002 | Grossnickle et al. |
| 6,452,438 B1 | 9/2002 | Li |
| 6,577,514 B2 | 6/2003 | Shor et al. |
| 6,608,526 B1 * | 8/2003 | Sauer ........................ 330/264 |
| 6,614,295 B2 | 9/2003 | Tsuchi |
| 6,627,555 B2 | 9/2003 | Eitan et al. |
| 6,654,296 B2 | 11/2003 | Jang et al. |
| 6,665,769 B2 | 12/2003 | Cohen et al. |
| 6,677,805 B2 | 1/2004 | Shor et al. |
| 2002/0145465 A1 | 10/2002 | Shor et al. |
| 2003/0076159 A1 | 4/2003 | Shor et al. |
| 2003/0202411 A1 | 10/2003 | Yamada |
| 2004/0151034 A1 | 8/2004 | Shor et al. |

* cited by examiner

US 6,885,244 B2

OPERATIONAL AMPLIFIER WITH FAST RISE TIME

FIELD OF THE INVENTION

This invention relates to operational amplifiers in general, and voltage regulators in particular.

BACKGROUND OF THE INVENTION

Operational amplifiers (op-amps) in general, and particularly voltage regulators are circuits that provide analog voltages, generally in integrated circuits, such as memory circuits. In many cases, op-amps provide an output voltage, which is a fixed multiple of an input or reference voltage. In the general case, this input voltage may be a signal whose voltage changes with time, while in the case of a voltage regulator, the input is generally at a fixed DC level.

FIG. 1 illustrates a simple, prior art op-amp 7, well known in the art. A differential stage GM1 provides a voltage output for a differential voltage input. The differential stage GM1 receives an input voltage Vref at one of its inputs (the negative input in the illustration). The output PG of differential stage GM1 is connected to the input or gate (designated "g" in FIG. 1) of a PMOS (p-channel metal oxide semiconductor) transistor M1, which serves as an inverting gain stage or inverting stage. The supply terminal or source of transistor M1 (designated "s" in FIG. 1) is connected to positive voltage supply Vdd. The output or drain terminal of transistor M1 (designated "d" in FIG. 1) is connected to a current load element I1 via a node 5. In FIG. 1, I1 is a resistive voltage divider, but in the general case it may be any element that draws current, such as but not limited to, a transistor, current source, diode, etc. The output of transistor M1 is designated as OP and is also the output OP of op-amp 7. The output OP is also connected to a capacitive load CL. The output of the current load element I1 is connected to the second input (the positive input in the illustration) of differential stage GM1 as its feedback FB. The feedback in op-amp 7 may equalize the two inputs to differential stage GM1, and accordingly, the output OP is at a voltage determined by the resistor ratio in current load element I1. Unlike the well-known Miller architecture, op-amp 7 does not contain a compensating capacitor between the gate and drain of transistor M1, but rather relies on the large output capacitor CL for stability. Part of the stability condition is that transistor M1, i.e., the inverting stage, should be a weak transistor. This means that transistor M1 should have a low current driving capability, or transconductance, gm. In addition, differential stage GM1 should be a strong stage, having a large gm. This type of architecture is very common in flash and other memory integrated circuits, where it is important to regulate voltage on very large capacitors (50 pF–200 pF typically).

During steady-state conditions, the currents in transistor M1 and current load element (e.g., resistor divider) I1 are essentially equal, and the output has reached its final value. When the op-amp 7 is turned on, or when the input voltage is changed, the feedback action causes the current in transistor M1 to either increase or decrease, as is appropriate, thereby to ramp output OP to a new steady state. During these transient conditions, the input voltage of transistor M1 may be driven to either the positive (Vdd) or negative (GND) supply rails. Enabling of the regulator and a fast ramp to the steady state value of output OP are of particular interest in voltage regulator applications. Output OP is usually grounded before the op-amp 7 is turned on and needs to be driven to a high positive value quickly. During the transient condition, the input voltage of transistor M1 may be driven to GND.

In general, the current (ID) in transistor M1 is defined by:

$$ID = k\frac{W}{L}(Vgs - Vt) \quad (1)$$

where k is a constant, Vgs is the gate-source voltage, Vt is the threshold voltage and W, L are the dimensions of the transistor. During transient conditions, current ID may be several times that of steady-state conditions. As mentioned earlier, in this op-amp architecture, transistor M1 is the weaker stage, and thus is the limiting factor for the fast-ramp to a final output OP.

FIG. 2 illustrates a similar op-amp architecture to that illustrated in FIG. 1. The architecture of FIG. 2 differs from that of FIG. 1 in that the differential stage GM1 and the transistor M1 have Vdd as their positive supply, while the output OP is at a different (preferably higher) supply, Vpp. The current from transistor M1 is mirrored to the output by cascaded current mirrors, comprising transistors M3A–M3B and M4A–M4B.

Transistors M3A and M3B may be NMOS (n-channel metal oxide semiconductor) transistors, whereas transistors M4A and M4B may be PMOS transistors. As is known in the art, a current mirror receives a current at its input, and sources or sinks an identical or multiplied current at its output. Transistor M1 provides current to the connected gate/drain of transistor M3A. Transistor M3B is matched to transistor M3A, having the same, or multiplied dimensions, and since it has the same Vgs voltage, its output current will be identical to (or multiplied by) that of transistor M3A, as in equation (1). This current is further mirrored to OP by the M4A–M4B current mirror. In short, the level of transistor M1 is shifted to the higher voltage level at output OP such that the output OP may be as high as the Vpp supply. This is accomplished by current mirrors, which provide a current path to the OP node.

During the turn-on of the op-amp of FIG. 2, it is desired to achieve a fast ramp of output OP to its steady state value. Assuming typical values wherein Vdd=1.8V, Vpp=10V, Vt=1V and CL=100 pF, the ramping of OP may be limited by the transistor M1 current on the output capacitor CL. As mentioned earlier, transistor M1, i.e., the inverting stage, needs to be a weak stage, and since its supply span is small, the difference between its transient current and steady state current is also small (for example a factor of 2), and thus under these conditions, the OP voltage may rise slowly.

FIG. 3 illustrates another version of a prior-art circuit. In this case, the output of transistor M4B is buffered to output OP. This may be accomplished by connecting the output (drain) of transistor M4B to a capacitor C1 and to an NMOS transistor M5, which is configured as a source follower. The main difference between the configuration of FIG. 3 and of FIG. 2 is in the architecture of FIG. 3 the output of the current path of transistor M1 is a current source I2, and not the output load, current load element I1.

SUMMARY OF THE INVENTION

The present invention seeks to provide a circuit and a method that enables the output voltage of an operational amplifier (op-amp) to rise rapidly, without increasing the strength of the inverting stage. The circuit may distinguish between transient and steady-state conditions in its driver stage. During transient conditions, an auxiliary driver circuit may add current to the current path of the driver, thus enabling the output to rise faster. Under steady-state conditions, this auxiliary circuit may be dormant and all of the output current may be provided by the driver.

There is thus provided in accordance with an embodiment of the present invention an operational amplifier comprising an inverting stage transistor that drives current to an output of the operational amplifier through a current path, and an auxiliary transistor that adds transient current to the current path and which remains dormant under steady-state conditions.

In accordance with an embodiment of the present invention the current path current path comprises a direct connection between the inverting stage transistor and the output. Alternatively, the current path comprises a current mirror and/or a folding element connected between the inverting stage transistor and the output.

Further in accordance with an embodiment of the present invention a differential stage is provided whose voltage output is connected to an input of the inverting stage transistor. The inverting stage transistor may have a supply terminal at Vdd and a gate terminal connected to the output of the differential stage. The auxiliary transistor may have its supply terminal connected to a second supply voltage Vsupp, wherein Vsupp<Vdd.

Still further in accordance with an embodiment of the present invention Vsupp is biased such that during steady state conditions, the Vgs voltage across the auxiliary transistor is less than Vt of the auxiliary transistor and negligible current flows through the auxiliary transistor to the output of the amplifier.

The inverting stage and/or auxiliary transistors may comprise either PMOS (p-channel metal oxide semiconductor) transistors or NMOS (n-channel metal oxide semiconductor) transistors.

In accordance with an embodiment of the present invention the inverting stage transistor comprises a PMOS transistor, and the differential stage receives an input voltage, Vref, and outputs to a gate terminal of the inverting stage transistor, a source terminal of the inverting stage transistor is connected to a positive voltage supply, Vdd, a drain terminal of the inverting stage transistor is connected to a current load element, the current load element comprising at least one of a resistive voltage divider, a transistor, a current source, and a diode, the drain terminal of the inverting stage transistor is connected to a capacitive load, an output of the current load element is connected to another input of the differential stage as feedback, a gate terminal of an auxiliary PMOS transistor is connected to the gate of the inverting stage transistor and to the output of the differential stage, the drain terminals of the inverting stage transistor and the auxiliary PMOS transistor are connected to the output of the operational amplifier, and a supply terminal of the auxiliary PMOS transistor is connected to a second supply voltage Vsupp, wherein Vsupp<Vdd, and wherein Vsupp is biased, such that during steady state conditions, the Vgs voltage across the auxiliary PMOS transistor is less than a threshold voltage of the auxiliary PMOS transistor and negligible current flows through the auxiliary PMOS transistor to the output of the amplifier.

There is also provided in accordance with an embodiment of the present invention an operational amplifier comprising an inverting stage PMOS transistor that drives current to an output of the operational amplifier through a current path, and an auxiliary transistor that adds current to the current path during transient conditions, wherein the differential stage receives an input voltage, Vref, and outputs to a gate terminal of the inverting stage PMOS transistor, a source terminal of the inverting stage PMOS transistor is connected to a positive voltage supply, Vdd, a drain terminal of the inverting stage PMOS transistor is connected to a current load element, the current load element comprising at least one of a resistive voltage divider, a transistor, a current source, and a diode, the drain terminal of the inverting stage PMOS transistor is connected to a capacitive load, an output of the current load element is connected to another input of the differential stage as feedback, a gate terminal of an auxiliary PMOS transistor is connected to the gate of the inverting stage PMOS transistor and to the output of the differential stage, the drain terminals of the inverting stage PMOS transistor and the auxiliary PMOS transistor are connected to the output of the operational amplifier, and a supply terminal of the auxiliary PMOS transistor is connected to a second supply voltage Vsupp, wherein Vsupp<Vdd.

There is also provided in accordance with an embodiment of the present invention an operational amplifier comprising an inverting stage transistor that drives current to an output of the operational amplifier through a current path, and an auxiliary circuit that adds current to the current path during transient conditions.

In accordance with an embodiment of the present invention the auxiliary circuit remains dormant under steady-state conditions. Alternatively, the auxiliary circuit may add current under steady-state conditions.

Further in accordance with an embodiment of the present invention the auxiliary circuit may sink or source current in the current path.

Still further in accordance with an embodiment of the present invention the auxiliary circuit comprises a differential pair of transistors (e.g., PMOS transistors) coupled to a current mirror, and a current difference of the differential pair is added to the current path.

Additionally in accordance with an embodiment of the present invention the gate of one transistor of the differential pair is coupled to the gate of the inverting stage transistor and the gate of the other transistor of the differential pair is coupled to a bias.

In accordance with an embodiment of the present invention the auxiliary circuit comprises a pair of transistors whose supply terminals are connected to a supply voltage Vsupp, to which is also connected a current source, the current source being connected to a first supply voltage Vdd, and wherein the gate terminal of a first transistor of the pair of transistors is connected to the gate terminal, PG, of the inverting stage transistor, and the gate terminal of a second transistor of the pair of transistors is fixed at a DC voltage, PG-$\delta$, wherein when PG$\geq$PG-$\delta$, no current is driven to the output of the amplifier, and when PG<PG-$\delta$, at least a portion of the current from the current source is directed to the output of the amplifier.

Further in accordance with an embodiment of the present invention the auxiliary circuit comprises a differential pair of transistors (e.g., PMOS transistors) coupled to a current mirror, and a current difference of the differential pair is added to the current path.

Still further in accordance with an embodiment of the present invention the current from one of the differential pair of transistors is subtracted from the other of the differential pair of transistors by the current mirror, and the current difference is added to the current path of the amplifier.

In accordance with an embodiment of the present invention the operational amplifier further comprises a second voltage supply Vpp, wherein the inverting stage transistor and the auxiliary circuit operate from the first supply voltage Vdd, and wherein the current path is mirrored to a current mirror operating from the second supply voltage Vpp, wherein the output of the operational amplifier is the output of the current mirror. The drain terminal of the first transistor may be connected to the current path.

Further in accordance with an embodiment of the present invention the drain terminal of the first transistor of the pair of transistors is connected to a drain terminal of a first NMOS transistor, and the drain terminal of the second transistor of the pair of transistors is connected to a drain terminal of a second NMOS transistor, wherein gate terminals of the first and second NMOS transistors are connected to one another, and the gate and drain terminals of the second NMOS transistor are connected to one another, and wherein the drain terminal of the first NMOS transistor is connected to a drain terminal of a third NMOS transistor, the gate and drain terminals of the third NMOS transistor being connected to one another, and wherein a gate terminal of the third NMOS transistor is connected to a gate terminal of a fourth NMOS transistor, a drain terminal of the fourth NMOS transistor being connected to the current path of the operational amplifier, and wherein current from the second transistor of the pair of transistors is subtracted from that of the first transistor of the pair of transistors transistor by the first and second NMOS transistors.

Still further in accordance with an embodiment of the present invention the difference in current between the pair of transistors flows through the third NMOS transistor, and is mirrored into the current path by the fourth NMOS transistor, and when PG≧PG−d, the current in the fourth NMOS transistor is negligible, and conversely, when PG<PG−d, the current in the fourth NMOS transistor is significant.

BRIEF DESCRIPTION OF DRAWINGS

The present invention will be further understood and appreciated from the following detailed description taken in conjunction with the drawing in which.

DETAILED DESCRIPTION OF EMBODIMENTS OF THE INVENTION

Figure 4:
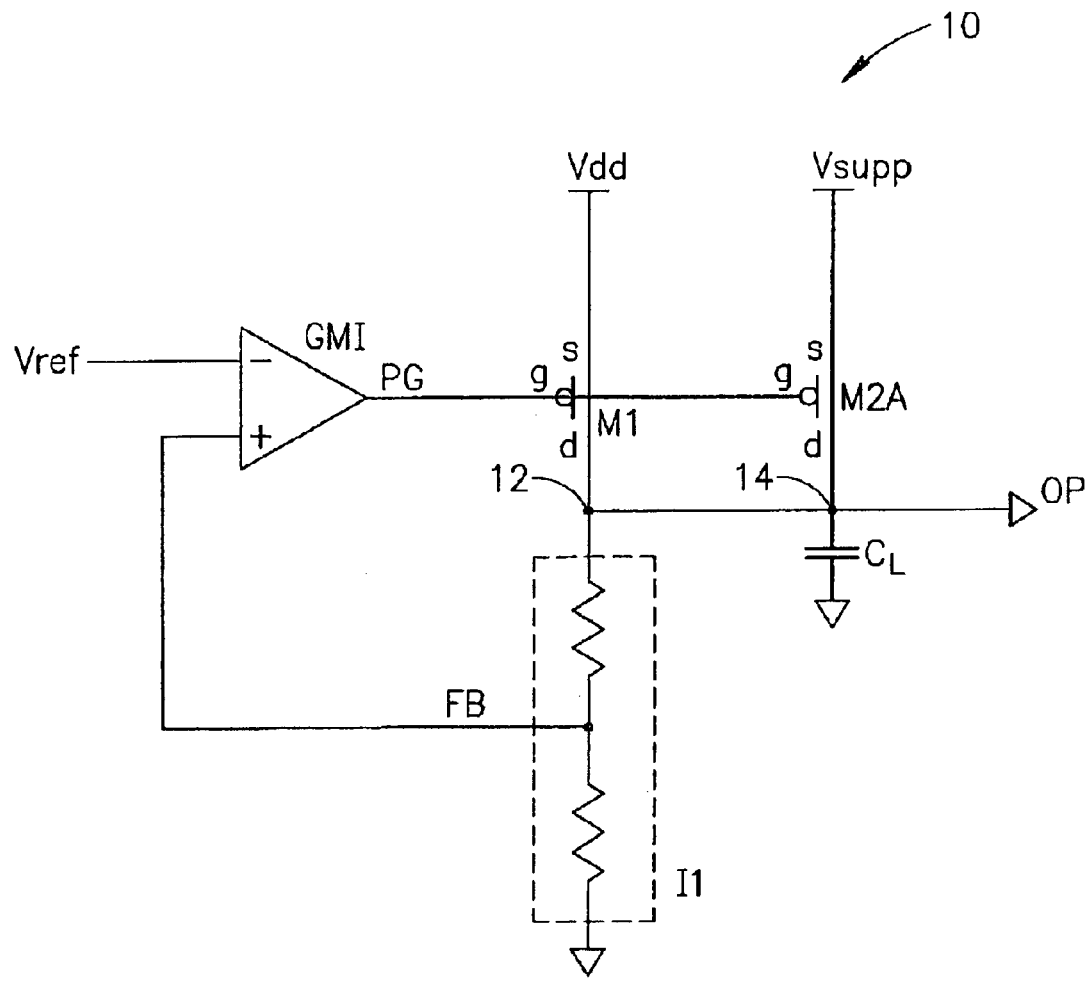
FIG. 4 is a simplified circuit schematic of an op-amp, constructed and operative in accordance with an embodiment of the invention.

Reference is now made to FIG. 4, which illustrates an op-amp 10, constructed and operative in accordance with an embodiment of the invention.

Op-amp 10 may drive an output capacitor CL and a current load element I1 in a manner described hereinabove with reference to FIG. 1. Accordingly, the output of current load element (e.g., resistor divider) I1 may be connected to the second input (the positive input in FIG. 4) of differential stage GM1 as its feedback FB. The inverting stage transistor M1 is illustrated as a PMOS transistor with its supply terminal at Vdd and gate connected to the output PG of differential stage GM1. The output (drain) terminal of transistor M1 may be connected to current load element I1 via a node 12. An auxiliary PMOS transistor M2A may be added with its gate terminal connected to the gate of transistor M1 and to output PG of differential stage GM1. The drain terminal of transistor M1 may be connected via nodes 12 and 14 to output OP. The drain terminal of transistor M2A may be connected to output OP. Capacitor CL may be connected to output OP via node 14.

The supply terminal of transistor M2A may be connected to a second supply voltage Vsupp, wherein Vsupp<Vdd. Vsupp may be biased such that during steady state conditions, the Vgs voltage across transistor M2A is less than Vt and negligible current flows through transistor M2A to the output. Thus, the presence of transistor M2A may not affect the stability criteria. However, during transient conditions, when PG drops sufficiently, the Vgs of transistor M2A may exceed a threshold, and a large current may be added to the output, which may promote a faster rise to the steady state value of output OP.

In the example illustrated in FIG. 4, the output OP and its loads are at the Vdd supply. However, the invention is not limited to this example, and the invention may also be carried out wherein the inverting stage current is mirrored to a higher voltage, as in the current mirrors shown in FIGS. 2 and 3. The inverting stage and auxiliary transistor may also be NMOS. In general, in preferred embodiments of the invention, the auxiliary transistor adds transient current to the current path between the inverting stage and the output, and remains dormant under steady-state conditions. This current path may include, without limitation, a direct connection between the inverting stage and the output. The current path may comprise an indirect connection between the inverting stage and the output, wherein the indirect connection may comprise, without limitation, current mirrors or folding elements.

In the embodiment of FIG. 4, extra transient current may be added by a single transistor (M2A). Other embodiments are described now, which instead of a single transistor, may utilize differential transconducting auxiliary stages.

Figure 5:
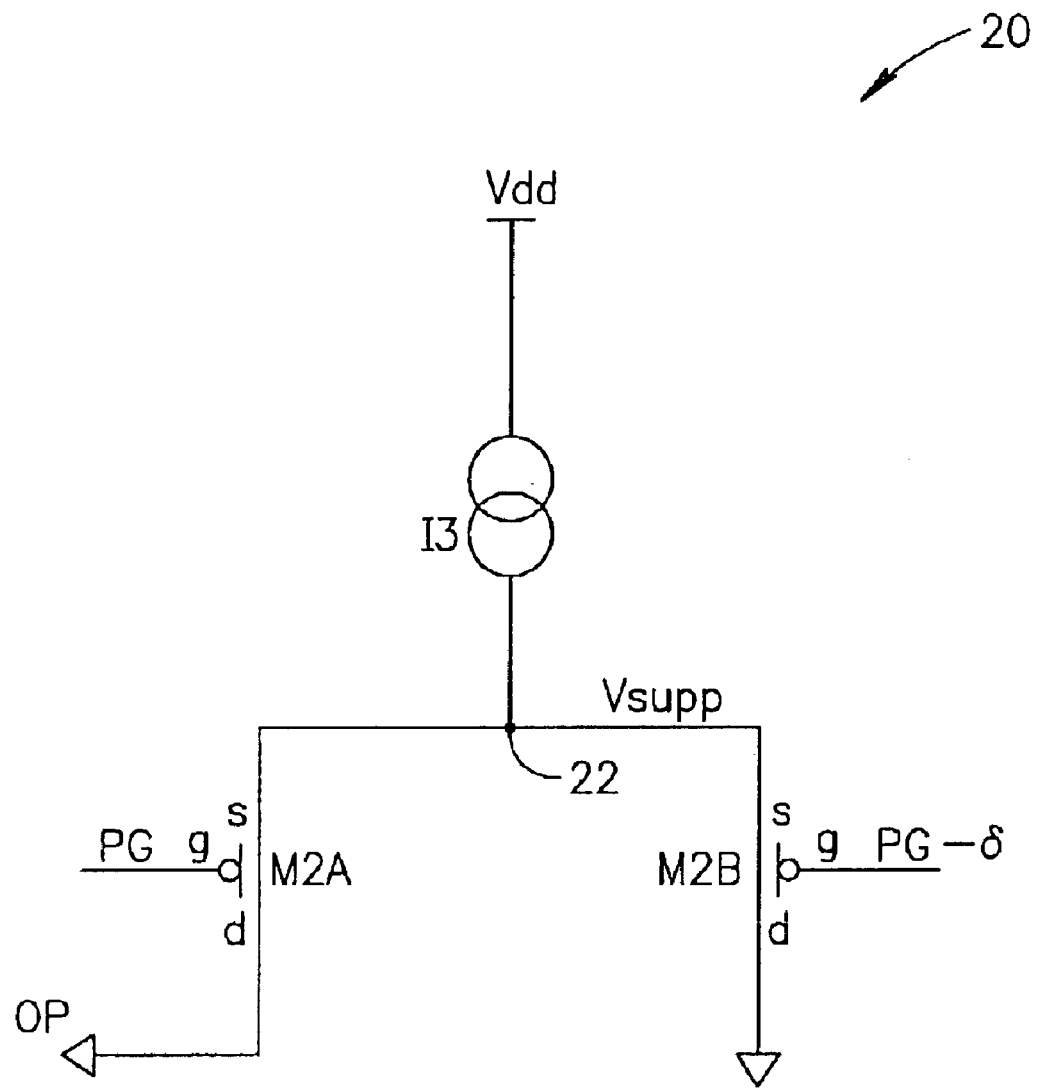
FIG. 5 is a simplified circuit schematic of an auxiliary circuit that may be added to and utilized in the circuitry of FIG. 4, in accordance with an embodiment of the invention.

Reference is now made to FIG. 5, which illustrates an auxiliary circuit 20 which may be added to and utilized in the circuitry of FIG. 4, in accordance with an embodiment of the invention. Auxiliary circuit 20 may comprise a differential pair of transistors (e.g., PMOS transistors) coupled to a current mirror, wherein the gate of one transistor of the pair may be coupled to the driver (e.g., output PG of differential stage GM1 from FIG. 4), and the gate of the other transistor of the pair may be coupled to some bias, an example of which will now be described. The current difference of the differential pair may be added to the current path.

In the illustrated embodiment, auxiliary circuit 20 may comprise transistor M2A, such as the same PMOS transistor shown in FIG. 4, and a current source I3 and a transistor M2B, which may be a PMOS transistor. Current source I3 may be connected to Vdd. The supply terminals of transistors M2A and M2B may be connected to supply voltage Vsupp at node 22. The gate of transistor M2B may be fixed at a DC voltage PG−δ, which may be slightly lower than the steady state voltage at node PG by an amount δ. When PG≧PG−δ, as in the steady state conditions, no current is driven to the output, OP, and the circuit is in an inactive state. When PG(transient)<PG−δ, as in transient conditions, all or part of the current from current source I3 may be directed to the output OP. This current that is directed to output OP may be added to the overall current of the amplifier.

Figure 6:
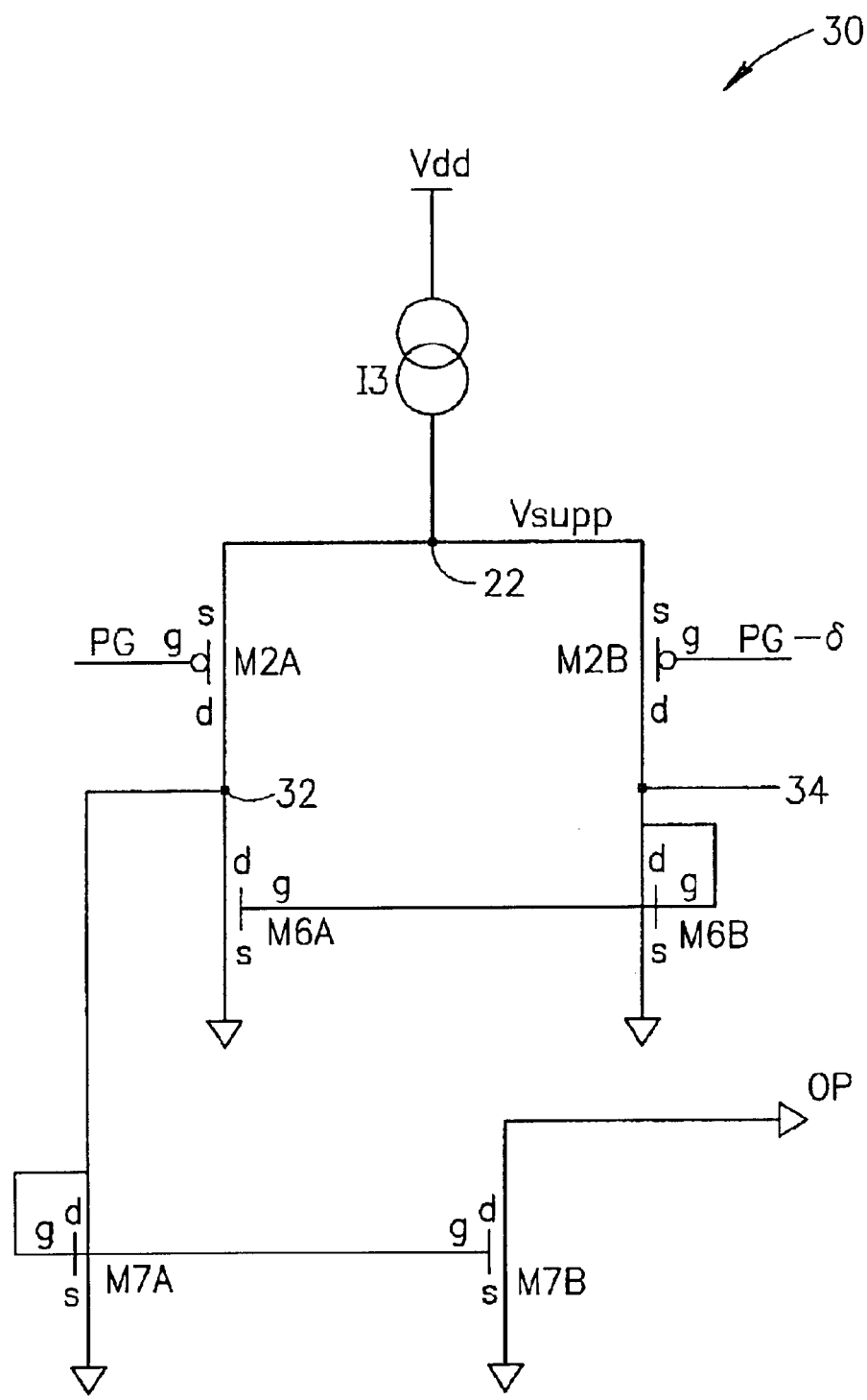
FIG. 6 is a simplified circuit schematic of another auxiliary circuit that may be added to and utilized in the circuitry of FIG. 4, and comprising a current mirror, in accordance with another embodiment of the invention.

Reference is now made to FIG. 6, which illustrates another auxiliary circuit 30, a current sink circuit (a circuit that pulls down, i.e., sinks, current), which may be added to and utilized in the circuitry of FIG. 4, in accordance with another embodiment of the invention. The circuitry of FIG. 6 is similar to that of FIG. 5 with some additions. For example, in the illustrated embodiment, an NMOS transistor M6A may be connected at its drain to the drain of transistor M2A at a node 32. An NMOS transistor M6B may also be added to the circuitry, wherein the drain of transistor M6B is connected to the drain of transistor M2B at a node 34. The gates of transistors M6A and M6B may be connected to one another. The gate of transistor M6B may be connected to its drain. An NMOS transistor M7A may be connected at its drain to the drain of transistor M6A. The gate of transistor M7A may be connected to its drain. An NMOS transistor M7B may be connected at its gate to the gate of transistor M7A. The drain of transistor M7B may be connected to the output OP.

In FIG. 6, the current from transistor M2B may be subtracted from that of transistor M2A by the transistor pair M6A and M6B. The difference of these currents may flow through transistor M7A, and may be mirrored into the current path of the overall amplifier by transistor M7B. When PG≧PG−d, the current in transistor M7B is zero; conversely, when PG<PG−d, the current in transistor M7B is large and a lot of current may thus be added to the current path.

Figure 7:
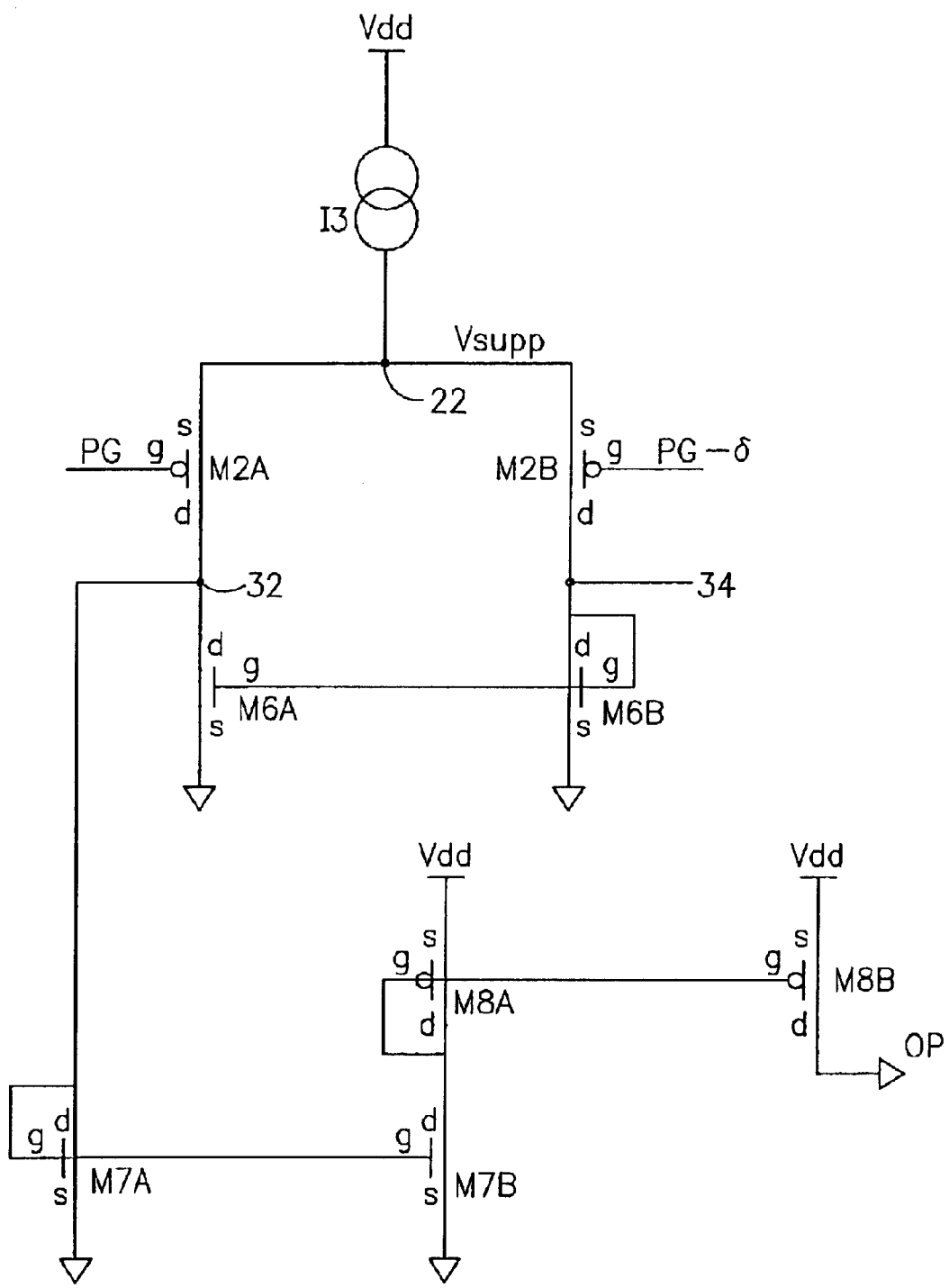
FIG. 7 is a simplified circuit schematic of yet another auxiliary circuit that may be added to and utilized in the circuitry of FIG. 4, and comprising an additional current mirror, in accordance with another embodiment of the invention.

Reference is now made to FIG. 7, which illustrates another implementation which adds to the circuitry of FIG. 6. The embodiment of FIG. 7 is a current source circuit (a circuit that pulls up, i.e., sources, current). The embodiment of FIG. 7 may have an additional current mirror comprising transistors M8A and M8B, which may be PMOS transistors, wherein the current is added as a source to the current path (i.e. current to Vdd, or the positive supply). In the illustrated embodiment, the drain of transistor M7B is connected to the drain of transistor M8A. The gate of transistor M8A may be connected to its drain. The source of transistor M8A may receive a voltage Vdd. The gate of transistor M8A may be connected to the gate of transistor M8B. The source of transistor M8B may also receive voltage Vdd. The source of transistor M8B may be connected to the output OP.

Figure 1:
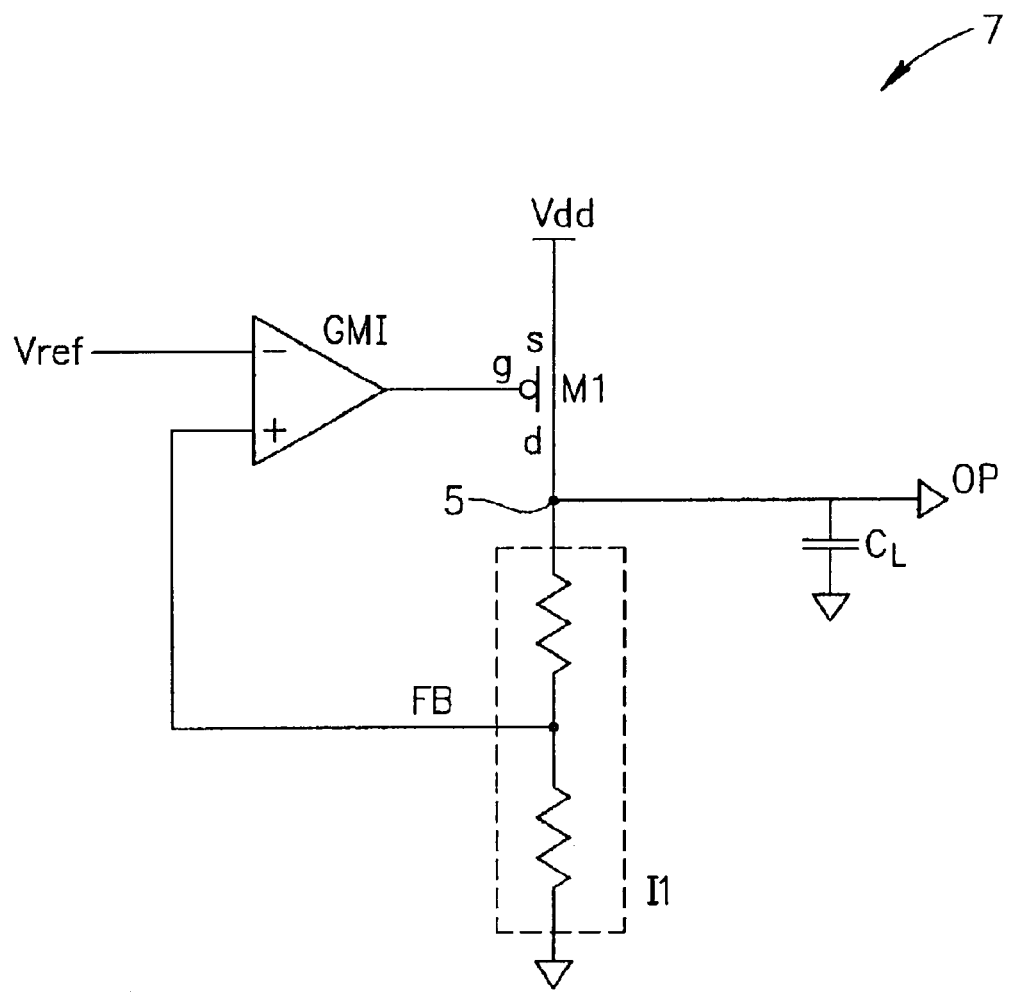
FIG. 1 is a simplified circuit schematic of an operational amplifier (op-amp) of the prior art, comprising amongst other components, a differential stage GM1 and a transistor M1 which have an output OP.
Figure 8:
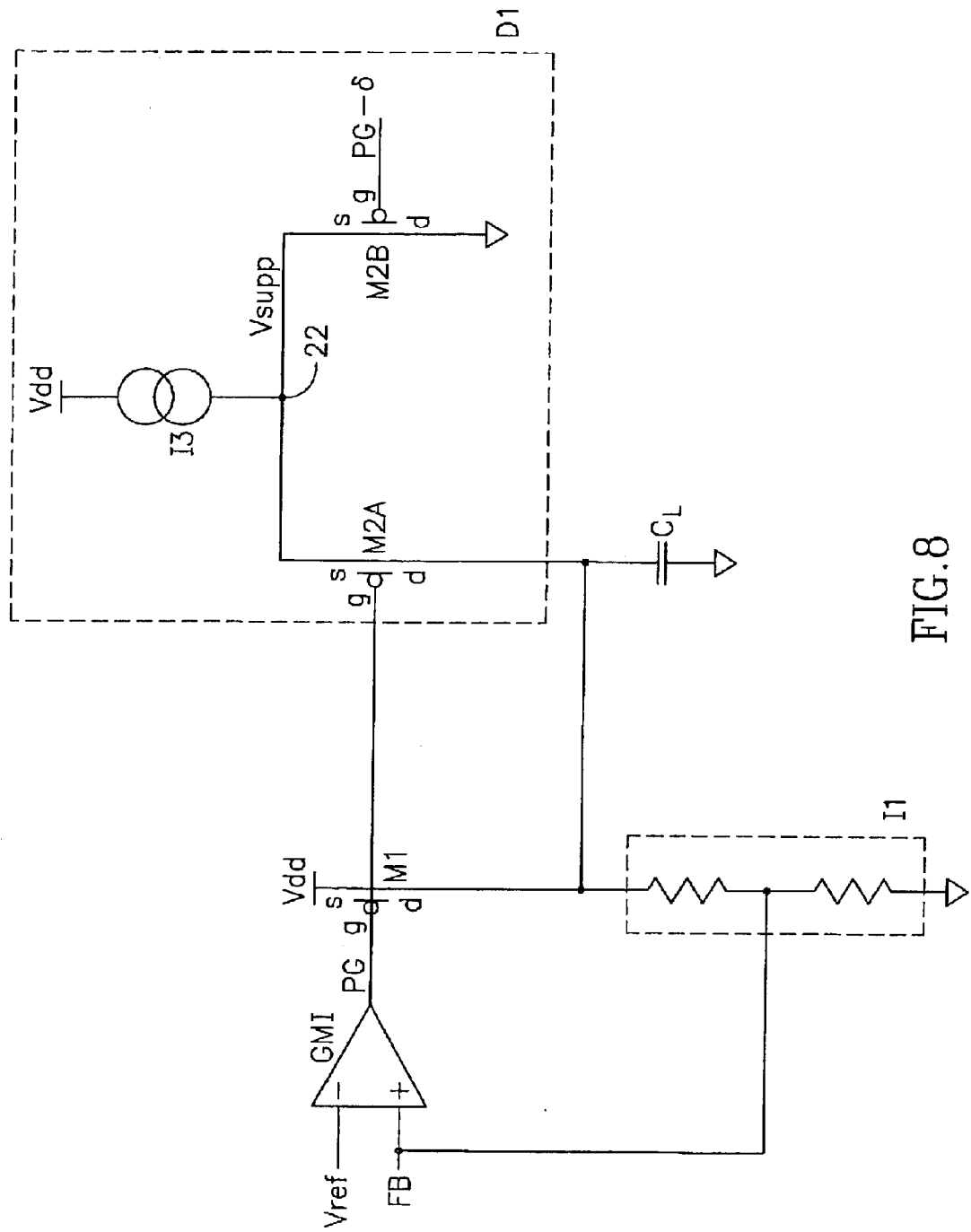
FIG. 8 is a simplified circuit schematic of the auxiliary circuit of FIG. 5 combined with the amplifier of FIG. 1, in accordance with an embodiment of the invention.

Reference is now made to FIG. 8, which illustrates another embodiment of the invention, wherein the auxiliary circuit of FIG. 5 is combined with the amplifier of FIG. 1. The auxiliary current from transistor M2A may be added directly to the output capacitor CL.

Figure 9:
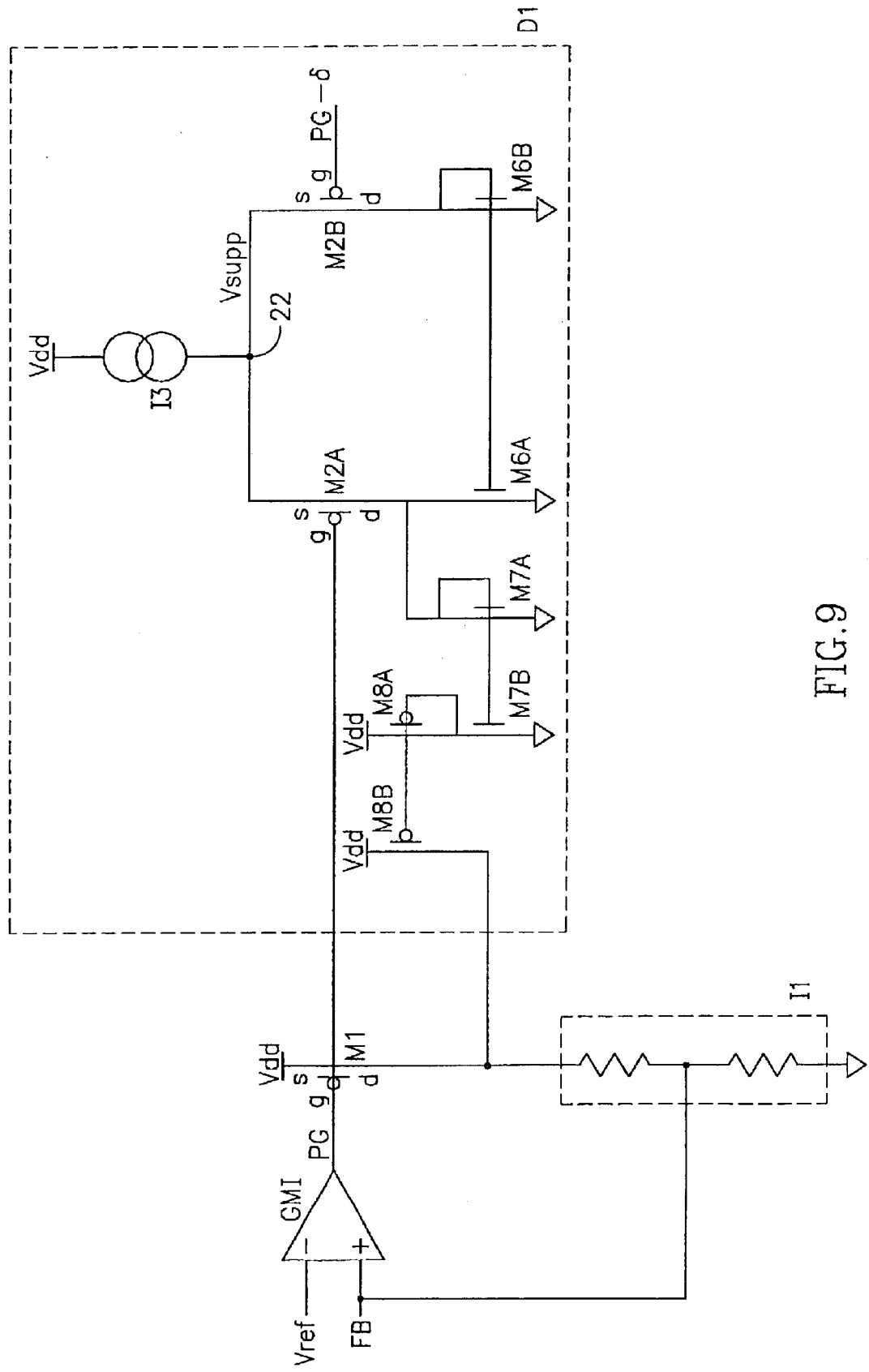
FIG. 9 is a simplified circuit schematic of the auxiliary circuit of FIG. 7 combined with the amplifier of FIG. 1, in accordance with an embodiment of the invention.

Reference is now made to FIG. 9, which illustrates yet another embodiment of the invention, wherein the auxiliary circuit of FIG. 7 is added to the amplifier of FIG. 1. The summed current in transistor M8B may be added to the current path directly to the output capacitor CL.

Figure 2:
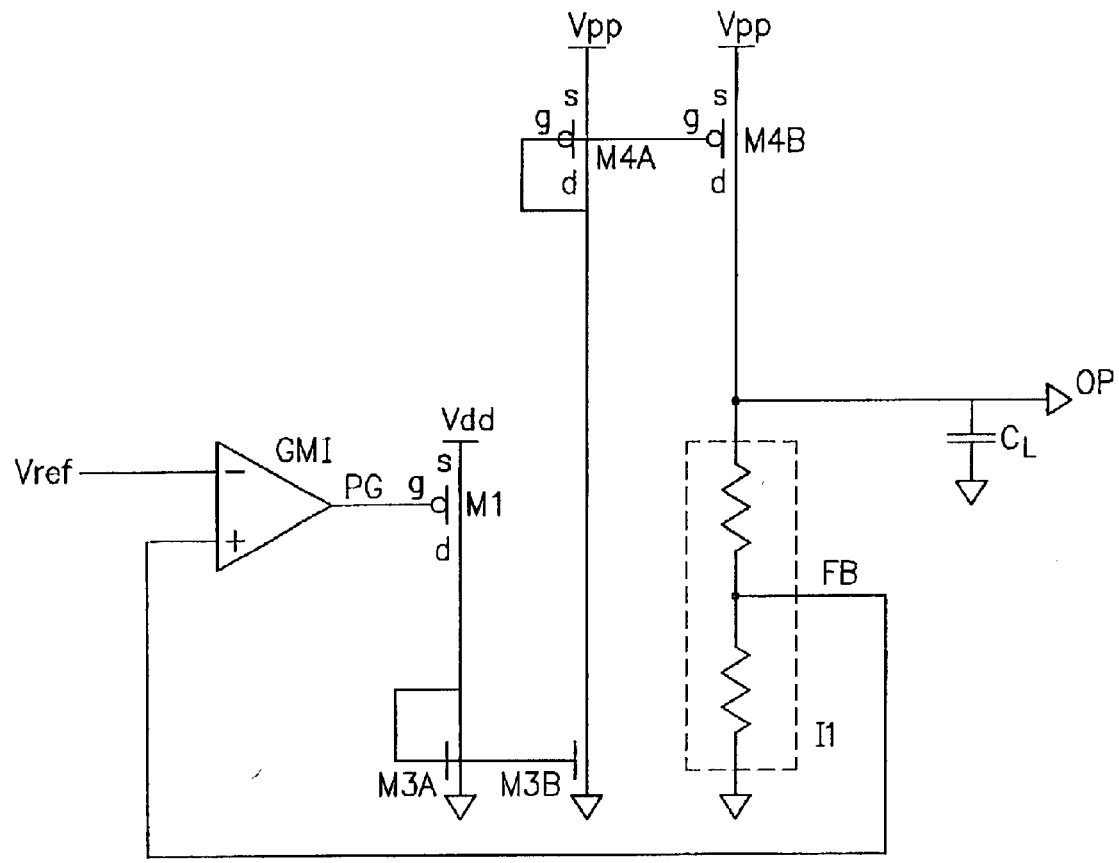
FIG. 2 is a simplified circuit schematic of a prior art op-amp architecture similar to that illustrated in FIG. 1, wherein the architecture of FIG. 2 differs from that of FIG. 1 in that the output OP is at a different (preferably higher) supply, accomplished by current mirrors, which provide a current path to the output OP node.
Figure 3:
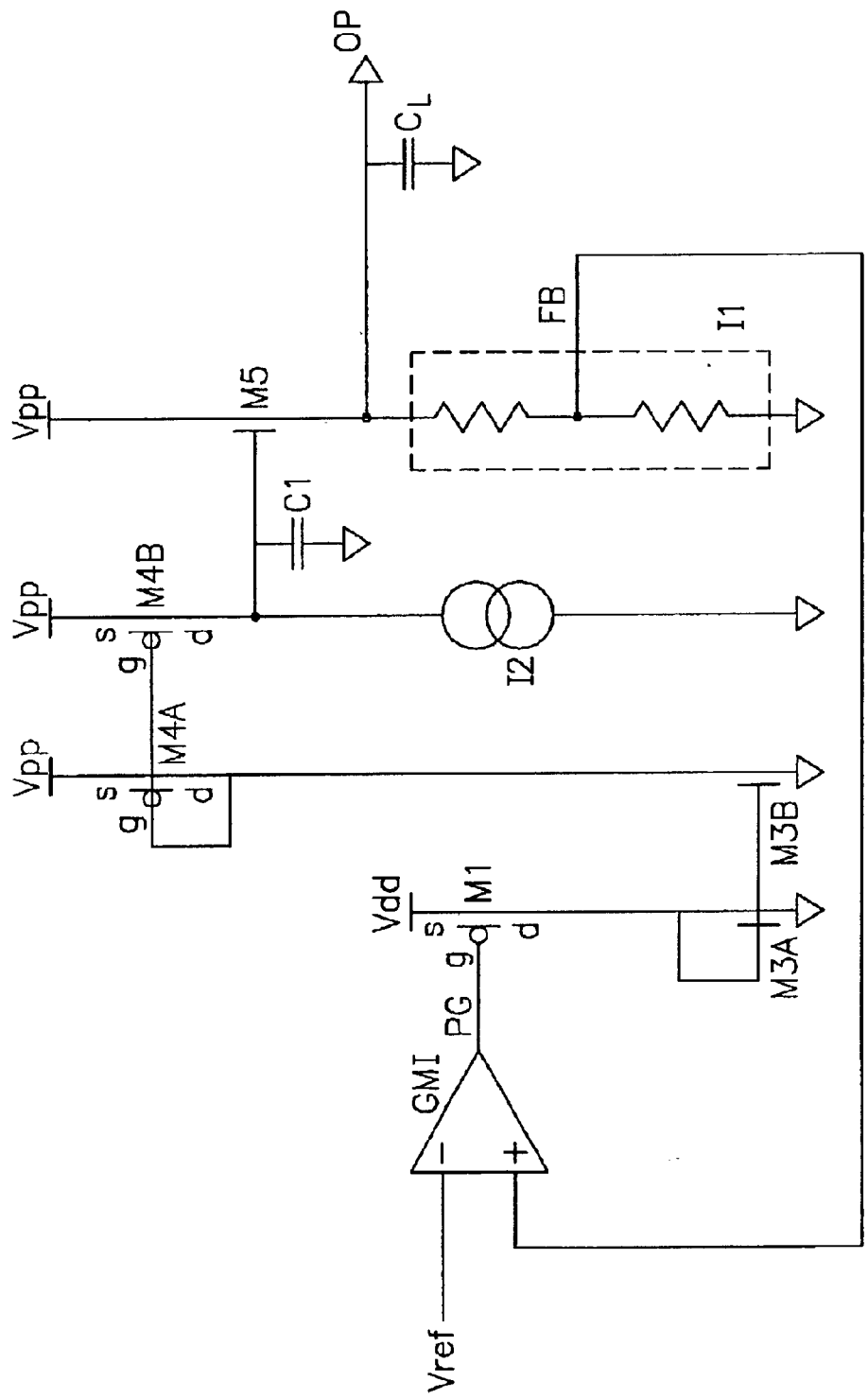
FIG. 3 a simplified circuit schematic of another prior art op-amp architecture, wherein the output of the current path of transistor M1 is a current source I2, and not the output load.
Figure 10:
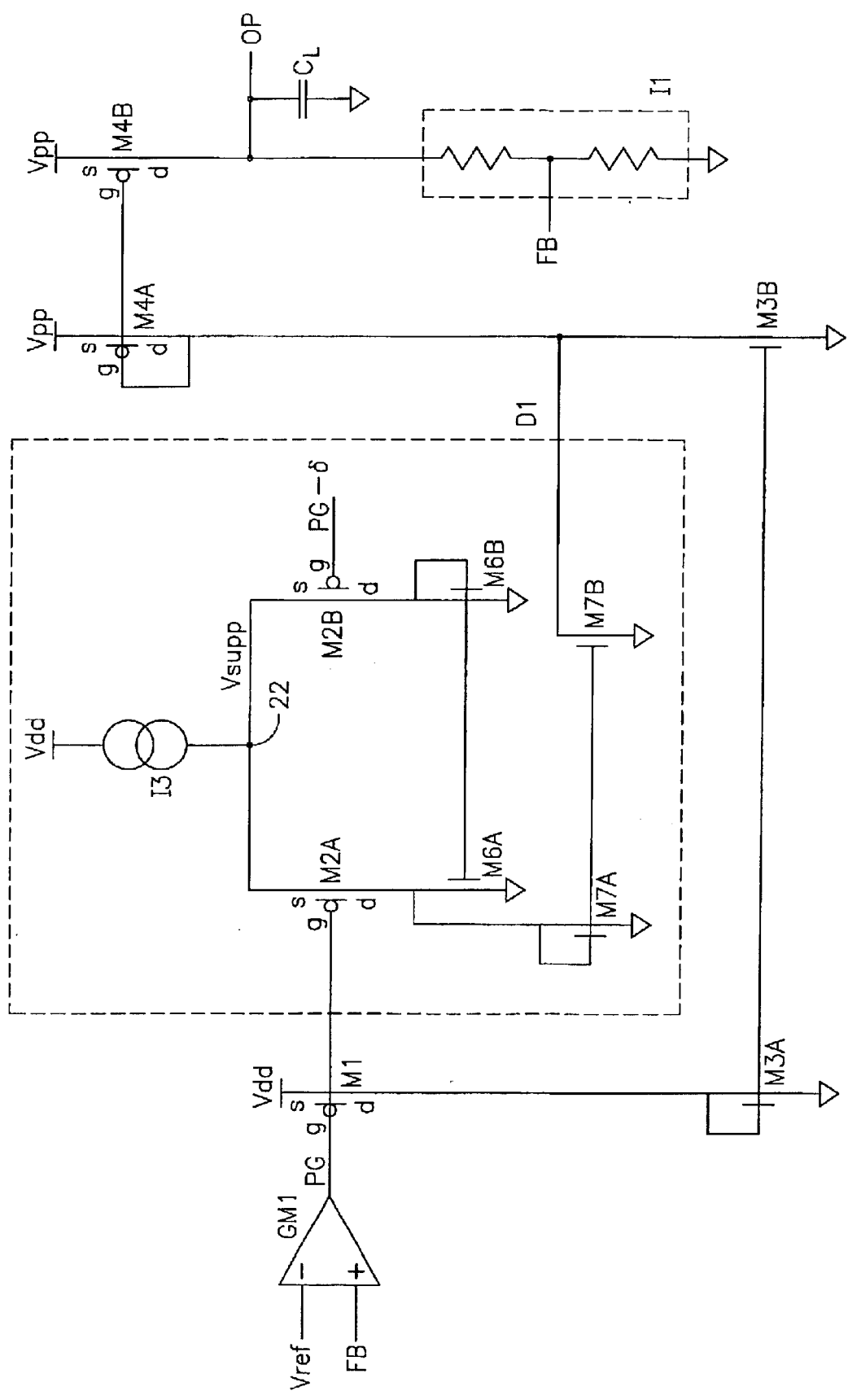
FIG. 10 is a simplified circuit schematic of the current sink circuit of FIG. 6 added to the amplifier of FIG. 2, in accordance with an embodiment of the invention.

Reference is now made to FIG. 10, which illustrates still another embodiment of the invention, wherein the current sink circuit of FIG. 6 is added to the amplifier of FIG. 2. The auxiliary current may be added to the current path from the Vdd supply, which may be mirrored to the Vpp-supply.

It is appreciated that various features of the invention which are, for clarity, described in the contexts of separate embodiments, may aso be provided in combination in a single embodiment. Conversely, various features of the invention which are, for brevity, described in the context of a single embodiment, may also be provided separately or in any suitable subcombination.

What is claimed is:

1. An operational amplifier comprising:
   an inverting stage transistor that drives current to an output of said operational amplifier through a current path;
   an auxiliary transistor that adds transient current to said current path and which remains dormant under steady-state conditions; and
   a differential stage whose voltage output is connected to an input of said inverting stage transistor,
   wherein said inverting stage transistor has a supply terminal at Vdd and a gate terminal connected to the output of said differential stage, and
   wherein said auxiliary transistor has its supply terminal connected to a second supply voltage Vsupp, wherein Vsupp<Vdd.

2. The operational amplifier according to claim 1, wherein Vsupp is biased such that during steady state conditions, the Vgs voltage across said auxiliary transistor is less than Vt of said auxiliary transistor and negligible current flows through said auxiliary transistor to the output of said amplifier.

3. An operational amplifier comprising:
   an inverting stage transistor that drives current to an output of said operational amplifier through a current path;
   an auxiliary transistor that adds transient current to said current path and which remains dormant under steady-state conditions; and
   a differential stage whose voltage output is connected to an input of said inverting stage transistor, wherein said inverting stage transistor comprises a PMOS transistor, and wherein said differential stage receives an input voltage, Vref, and outputs to a gate terminal of said inverting stage transistor, a source terminal of said inverting stage transistor is connected to a positive voltage supply, Vdd, a drain terminal of said inverting stage transistor is connected to a current load element, said current load element comprising at least one of a resistive voltage divider, a transistor, a current source, and a diode, said drain terminal of said inverting stage transistor is connected to a capacitive load, an output of said current load element is connected to another input of said differential stage as feedback, a gate terminal of an auxiliary PMOS transistor is connected to the gate of said inverting stage transistor and to the output of said differential stage, the drain terminals of said inverting stage transistor and said auxiliary PMOS transistor are connected to the output of said operational amplifier, and a supply terminal of said auxiliary PMOS transistor is connected to a second supply voltage Vsupp, wherein Vsupp<Vdd, and wherein Vsupp is biased, such that during steady state conditions, the Vga voltage across said auxiliary PMOS transistor is less than a threshold voltage of said auxiliary PMOS transistor and negligible current flows through said auxiliary PMOS transistor to the output of said amplifier.

4. An operational amplifier comprising:

an inverting stage PMOS transistor that drives current to an output of said operational amplifier through a current path; and an auxiliary transistor that adds current to said current path during transient conditions;

wherein said differential stage receives an input voltage, Vref, and outputs to a gate terminal of said inverting stage PMOS transistor, a source terminal of said inverting stage PMOS transistor is connected to a positive voltage supply, Vdd, a drain terminal of said inverting stage PMOS transistor is connected to a current load element, said current load element comprising at least one of a resistive voltage divider, a transistor, a current source, and a diode, said drain terminal of said inverting stage PMOS transistor is connected to a capacitive load, an output of said current load element is connected to another input of said differential stage as feedback, a gate terminal of an auxiliary PMOS transistor is connected to the gate of said inverting stage PMOS transistor and to the output of said differential stage, the drain terminals of said inverting stage PMOS transistor and said auxiliary PMOS transistor are connected to the output of said operational amplifier, and a supply terminal of said auxiliary PMOS transistor is connected to a second supply voltage Vsupp, wherein Vsupp<Vdd.

5. An operational amplifier comprising:

an inverting stage transistor that drives current to an output of said operational amplifier through a current path; and an auxiliary circuit that adds current to said current path during transient conditions, wherein said auxiliary circuit comprises a differential pair of transistors coupled to a current mirror, and a current difference of said differential pair is added to said current path.

6. The operational amplifier according to claim 5, wherein said differential pair of transistors comprise PMOS transistors.

7. The operational amplifier according to claim 5, wherein the gate of one transistor of said differential pair is coupled to the gate of said inverting stage transistor and the gate of the other transistor of said differential pair is coupled to a bias.

8. The operational amplifier according to claim 5, wherein said auxiliary circuit comprises a pair of transistors whose supply terminals are connected to a supply voltage Vsupp, to which is also connected a current source, the current source being connected to a first supply voltage Vdd; and wherein the gate terminal of a first transistor of the pair of transistors is connected to the gate terminal, PG, of said inverting stage transistor, and the gate terminal of a second transistor of the pair of transistors is fixed at a DC voltage, PG−δ, wherein when PG≧PG−δ, no current is driven to the output of the amplifier, and when PG<PG−δ, at least a portion of the current from said current source is directed to the output of the amplifier.

9. The operational amplifier according to claim 8, wherein said auxiliary circuit comprises a differential pair of transistors coupled to a current mirror, and a current difference of said differential pair is added to said current path.

10. The operational amplifier according to claim 9, wherein said differential pair of transistors comprise PMOS transistors.

11. The operational amplifier according to claim 9, wherein the current from one of the differential pair of transistors is subtracted from the other of the differential pair of transistors by the current mirror, and the current difference is added to the current path of the amplifier.

12. The operational amplifier according to claim 5, further comprising a second voltage supply Vpp, wherein said inverting stage transistor and said auxiliary circuit operate from said first supply voltage Vdd, and wherein said current path is mirrored to a current mirror operating from said second supply voltage Vpp, wherein the output of said operational amplifier is the output of said current mirror.

13. The operational amplifier according to claim 10, wherein the drain terminal of said first transistor is connected to the current path.

14. The operational amplifier according to claim 8, wherein the drain terminal of said first transistor of the pair of transistors is connected to a drain terminal of a first NMOS transistor, and the drain terminal of said second transistor of the pair of transistors is connected to a drain terminal of a second NMOS transistor, wherein gate terminals of said first and second NMOS transistors are connected to one another, and the gate and drain terminals of said second NMOS transistor are connected to one another, and wherein the drain terminal of said first NMOS transistor is connected to a drain terminal of a third NMOS transistor, the gate and drain terminals of said third NMOS transistor being connected to one another, and wherein a gate terminal of said third NMOS transistor is connected to a gate terminal of a fourth NMOS transistor, a drain terminal of said fourth NMOS transistor being connected to the current path of said operational amplifier, and wherein current from said second transistor of the pair of transistors is subtracted from that of said first transistor of the pair of transistors transistor by said first and second NMOS transistors.

15. The operational amplifier according to claim 14, wherein the difference in current between said pair of transistors flows through said third NMOS transistor, and is mirrored into said current path by said fourth NMOS transistor, and when PG≧PG−d, the current in said fourth NMOS transistor is negligible, and conversely, when PG<PG−d, the current in said fourth NMOS transistor is significant.

* * * * *